United States Patent [19]
Ohara

[11] Patent Number: 6,026,191
[45] Date of Patent: *Feb. 15, 2000

[54] DIGITAL CODING APPARATUS

[75] Inventor: Kazutake Ohara, Osaka, Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/585,416

[22] Filed: Jan. 11, 1996

[30] Foreign Application Priority Data

Jan. 9, 1995 [JP] Japan ................................. 7-000999

[51] Int. Cl.[7] ........................... G06K 9/36; H03M 7/40; H04N 7/12
[52] U.S. Cl. ............................ 382/232; 341/67; 348/403
[58] Field of Search .................................. 341/67, 59, 61, 341/95; 348/390, 420, 423, 403, 405; 382/250, 232

[56] References Cited

U.S. PATENT DOCUMENTS

| | | | |
|---|---|---|---|
| 4,593,267 | 6/1986 | Kuroda et al. | 341/67 |
| 5,162,795 | 11/1992 | Shirota | 341/67 |

FOREIGN PATENT DOCUMENTS

| | | | |
|---|---|---|---|
| 0 453 113 | 10/1991 | European Pat. Off. | H03M 7/40 |
| 0 492 537 | 1/1992 | European Pat. Off. | G06F 5/00 |
| 0 582 819 | 2/1994 | European Pat. Off. | H04N 7/133 |
| 0 587 324 | 3/1994 | European Pat. Off. | H03M 7/40 |
| 6-215492 | 8/1989 | Japan | G11B 20/18 |
| 5-176178 | 7/1993 | Japan | H04N 1/41 |
| 5-284487 | 10/1993 | Japan | H04N 7/133 |

*Primary Examiner*—David K. Moore
*Assistant Examiner*—Wenpeng Chen
*Attorney, Agent, or Firm*—McDermott, Will & Emery

[57] ABSTRACT

A digital coding apparatus of the present invention consists of a transform circuit, a variable-length coding circuit, and a fixed-length data generating circuit. The transform circuit performs a discrete cosine transform with respect to inputted image data and generates a DCT coefficient from a DC coefficient and AC coefficients. The variable-length coding circuit codes the DC coefficient and AC coefficients to a DC code and AC codes. The fixed-length data generating circuit generates a leading item of fixed-length data from the above DC code and a leading portion of the above AC codes, while sequentially generating items of fixed-length data other than the leading one from the remaining portion of the above AC codes. Consequently, the process of storing the DC code in the fixed-length data and the process of storing the AC codes in the fixed-length data can be performed collectively by pipeline processing.

5 Claims, 11 Drawing Sheets

| DC | 0 | 0 | 0 | 0 | 0 | 0 | 0 |
|----|---|---|---|---|---|---|---|
| 0  | 0 | 0 | 0 | 0 | 0 | 0 | 0 |
| 0  | 0 | 0 | 0 | 0 | 0 | 0 | 0 |
| 0  | 0 | 0 | 0 | 0 | 0 | 0 | 0 |
| 0  | 0 | 0 | 0 | 0 | 0 | 0 | 0 |
| 0  | 0 | 0 | 0 | 0 | 0 | 0 | 0 |
| 0  | 0 | 0 | 0 | 0 | 0 | 0 | 0 |
| 0  | 0 | 0 | 0 | 0 | 0 | 0 | 100 |

63-TH AC COEFFICIENTS

MATRIX OF DISCRETE COSINE TRANSFORM COEFFICIENTS
(8 COLUMNS X 8 ROWS)

| DC | 1 | 5 | 6 | 14 | 15 | 27 | 28 |
|----|----|----|----|----|----|----|----|
| 2 | 4 | 7 | 13 | 16 | 26 | 29 | 42 |
| 3 | 8 | 12 | 17 | 25 | 30 | 41 | 43 |
| 9 | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

ZIGZAG SCANNING

DCT COEFFICIENTS

| DC | 1 | 2 | 3 | ------------------- | 62 | 63 |

AC COEFFICIENTS

FIG. 11
PRIOR ART

DIGITAL CODING APPARATUS

BACKGROUND OF THE INVENTION

The present invention relates to a digital coding apparatus for use in compression of image data or the like.

Below, a description will be given to a typical method of compressing image data by means of a digital coding apparatus.

Initially, image data is divided into small blocks of about 8×8 pixels, which are then subjected to a two-dimensional discrete cosine transform performed by a discrete cosine transform circuit. The discrete cosine transform is a kind of orthogonal transformation whereby coordinates of the image data may be transformed from space coordinates to frequency coordinates.

In general, since only slight variations exist in the color or lightness of neighboring pixels in a natural image, its spatial frequency represented by the number of variations per unit distance is low. Consequently, individual elements of a transfer coefficient matrix obtained through the two-dimensional discrete cosine transform have large values if they represent low-frequency components. Conversely, if the individual elements of the transfer coefficient matrix represent high-frequency components, they have substantially zero values. By utilizing the above feature and coding in combination, compression of image data can be accomplished.

Next, from the transfer coefficient matrix, individual elements are sequentially read out as a DCT coefficient in the order in which the element representing the lowest-frequency component is read first. FIG. 11 shows the order in which the components of the DCT coefficient are read out from the transfer coefficient matrix. In the transfer coefficient matrix, the uppermost leftmost element represents the lowest-frequency component, while the lowermost rightmost element represents the highest-frequency component. The elements diagonally arranged therebetween represent increasingly higher-frequency components as they become closer to the lowermost rightmost element. The uppermost leftmost element is read out as a DC coefficient, followed by zigzag scanning, thereby sequentially reading out the other elements as AC coefficients. FIG. 11 shows the case where image data of 8×8 pixels is inputted. In the drawing, the DCT coefficient consisting of one DC coefficient and sixty-three AC coefficients has been outputted.

The above DCT coefficient is quantized by a quantize circuit, resulting in a quantized DCT coefficient.

Next, a variable-length coding circuit (hereinafter referred to as a VLC circuit) codes the DC coefficient into a DC code, while coding the AC coefficients into AC codes. In the process, variable-length Huffman coding is used.

Finally, a fixed-length data generating circuit generates fixed-length data from the DC code and AC codes and outputs it.

FIG. 7 is a block diagram showing the respective internal structures of the VLC circuit and of the fixed-data generating circuit in a conventional digital coding apparatus. In the drawing are shown: a VLC circuit 10; a judge circuit 11; an AC coding circuit 12; a DC coding circuit 13; a fixed-length data generating circuit 20A; a padding circuit 21 to fixed-length data; a first data write circuit 25; a first memory (RAM1) 26; a data holding circuit 27; a second memory (RAM2) 28; and a second data write circuit 29.

A description will be given of the operation of the circuit shown in FIG. 7. Here, it is assumed that the DCT coefficient as shown in FIG. 11 is inputted.

The judge circuit 11 judges whether each of the components of the inputted DCT coefficient is the DC coefficient or the AC coefficient and outputs the AC coefficients to the AC coding circuit 12, while outputting the DC coefficient to the DC coding circuit 13.

The AC coding circuit 12 detects a sequence of zero-valued AC coefficients and replaces them by a code representing the number of the consecutive 0s. Thereafter, the AC coding circuit 12 transforms the AC coefficients to variable-length Huffman codes and outputs them as AC codes.

The DC coding circuit 13 transforms the DC coefficient to a DC code and outputs it. However, in the case where the DC coefficient is used as it is as the DC code without being transformed, the DC coding circuit 13 becomes unnecessary.

The padding circuit 21 pads fixed-length data compactly with the variable-length AC code or AC codes in sequence.

The first data write circuit 25 writes the fixed-length data of AC code in the first memory 26.

The operation described above is performed by pipeline processing controlled by each clock.

The data holding circuit 27 stores in the second memory 28 the DC code outputted from the DC coding circuit 13 during the pipeline processing.

After the pipeline processing is temporarily suspended, the second data write circuit 29 stores in the first memory 26 the DC code read from the second memory 28 by the data holding circuit 17. At this point, since the sequential AC codes have been stored as fixed-length data in the first memory 26, the DC code should be placed so as not to overlap the AC codes.

FIG. 8 is an operational timing chart in the case where the conventional digital coding apparatus generates fixed-length data. In the drawing are shown: the second memory 28; a period 1 DCT required to process one DCT coefficient; and block units A, B, C, and D in accordance with which the pipeline processing is performed in the digital coding apparatus.

Upon the inputting of the DCT coefficient, the data holding circuit 17 initially stores the DC code in the second memory 28. On the other hand, the AC codes are sequentially processed by the pipeline processing so as to generate the fixed-length data of AC code. The number of clocks required to complete 1 DCT of pipeline processing is 64, which is equal to the total number of the DC coefficient and AC coefficients. The above processing is performed with respect to the plurality of DCT coefficients sequentially inputted.

When an image processing apparatus which receives data from the digital coding apparatus enters a blanking period, the DC code stored in the second memory 28 is read out by the data holding circuit 27 by non-pipeline processing. The read DC code is written by the second data write circuit 29 in the first memory 26 so as to generate the fixed-length data of DC code. FIG. 8 illustrates an example in which the image processing apparatus enters the blanking period every 15 DCTs. In this case, the number of DC codes to be processed during the blanking period is 15, while the number of clocks required by the non-pipeline processing is 15.

FIG. 9 is a view representing the content of the fixed-length data generated by the conventional digital coding apparatus and stored in the first memory 26. In the drawing is illustrated the case where the number of items of fixed-length data is the largest, i.e., where the number of the AC codes is 63 and the code length of each of the 63 AC codes is maximum. In this case, the fixed-length data generated from one DCT coefficient is composed of one DC code, 63 AC codes, and an EOB code representing the end position of the AC codes. If it is assumed that the storage area for one item of fixed-length data is 1 word, the largest number of items of fixed-length data generated from one DCT coefficient is 65 words.

FIGS. 10 are views representing the content of another example of fixed-length data generated by the conventional digital coding apparatus. As shown in FIG. 10(a), when the DCT coefficient in which all the AC coefficients except the 63rd one are zero-valued is given, the number of items of fixed-length data becomes 3 words as shown in FIG. 10(b).

However, the conventional digital coding apparatus has the following problems.

Since the conventional digital coding apparatus separately performs the AC code processing and the DC code processing in the fixed-length data generating circuit 20, it is disadvantageously increased in circuit scale. Moreover, since the AC code processing is pipeline processing and the DC code processing is non-pipeline processing, extra clocks are required, which disadvantageously increases power consumption.

Moreover, since the DC code processing is performed by utilizing the blanking period of the image processing apparatus, the conventional digital coding apparatus presents no problem in the case where it is applied to a display unit such as a monitor. However, in the case where data is accumulated in a storage medium such as a video memory, the DC code processing requires a period substituting for the blanking period, which presents a serious problem to higher-speed processing.

Furthermore, if the DC code processing as well as the AC coding processing is to be performed by pipeline processing in the conventional digital coding apparatus, it is difficult to retain compatibility with the structure of the apparatus associated with processing prior or subsequent to the pipeline processing. For example, since the largest number of items of fixed-length data generated from one DC coefficient and 63 AC coefficients become 65 words due to the presence of the EOB code in the case shown in FIG. 9, it follows that one DCT coefficient requires 65 clocks to be processed, which causes a time lag between the process of generating the DCT coefficient in the previous stage and the process of generating the fixed-length data. Moreover, since the EOB code is stored in 1 word after the 63rd AC code has been generated in the case shown in FIG. 10, processing requires a total of 65 clocks.

SUMMARY OF THE INVENTION

In view of the foregoing, an object of the present invention is to provide a digital coding apparatus which is smaller in circuit scale and lower in power consumption. With the digital coding apparatus of the present invention, high-speed processing can be achieved irrespective of the presence or absence of the blanking period in the image processing apparatus. In the digital coding apparatus of the present invention, moreover, the structure associated with pipeline processing can easily retain compatibility with the structure associated with processing prior or subsequent to the pipeline processing.

To attain the above object, the present invention enables single hardware to perform DC code processing as well as AC code processing and improves the format of generated fixed-length data so as to perform the pipeline processing, while maintaining compatibility with the structure associated with processing prior or subsequent to the pipeline processing.

Specifically, a digital coding apparatus according to present invention comprises: a transform circuit for performing a discrete cosine transform with respect to inputted data so as to generate a DC coefficient and AC coefficients based on a result of the transform and output them; a variable-length coding circuit for individually coding the DC coefficient and the AC coefficients, each outputted from the above transform circuit, into a DC code and AC codes; and a fixed-length data generating circuit for generating plural items of fixed-length data based on the DC code and the AC codes, each outputted from the above variable-length coding circuit, the above fixed-length data generating circuit generating the leading item of fixed-length data from the above DC code and a leading portion of the above AC codes, while sequentially generating the items of fixed-length data other than the leading one from a remaining portion of the above AC codes.

Thus, the fixed-length data generating circuit can perform the process of storing the DC code in the fixed-length data in conjunction with the process of storing the AC codes in the fixed-length data. As a result, the circuit required by the conventional apparatus in order to store the DC code in the fixed-length data becomes unnecessary, resulting in a significant reduction in circuit. Moreover, since the clocks for the non-pipeline processing become unnecessary in addition to the circuit reduction, power consumption can considerably be lowered. Furthermore, since it becomes unnecessary to perform processing during a blanking period, high-speed processing can be achieved whether an image processing apparatus to be used has the blanking period or not.

In the case where the sum of the code length of the above DC code and the code length of the EOB code representing the end position of the above AC codes is equal to or shorter than the length of the above fixed-length data, the number of items of generated fixed-length data never exceeds the total number of the DC code and AC codes, so that there is no need for an increase in the number of clocks, which is different from the conventional embodiment. Consequently, the process of storing the DC code and the AC codes in fixed-length data can be performed with excellent compatibility with processes prior and subsequent to the process thereof.

Alternatively, when the number of bits of the above fixed-length data is n and the number of bits of the above DC code is m, the above fixed-length data generating circuit preferably has: a padding circuit to fixed-length data which receives the above AC codes, sequentially connects the inputted AC codes, divides the connected AC codes into n-bit segments, and outputs the n-bit segments as fixed-length data of AC code; and a fixed-bit-width rotate circuit which receives the above DC code and the fixed-length data of AC code outputted from the above padding circuit to fixed-length data so as to generate the leading item of fixed-length data by connecting the above DC code to the upper (n–m) bits of a leading item of the fixed-length data of AC code, while sequentially generating the items of fixed-length data other than the leading one by connecting the lower m bits of the fixed-length data of one of the AC codes to the upper (n–m) bits of the fixed-length of the subsequent one of the AC codes.

Consequently, in the above fixed-length generating circuit, the process of storing the DC code in the fixed-length data and the process of storing the AC codes in the fixed-length data can be performed collectively and reliably by the single hardware.

BRIEF DESCRIPTION OF THE DRAWINGS

FIGS. 10 are views showing the content of the fixed-length data generated by the conventional digital coding apparatus, of which FIG. 11 is a view illustrating the DCT coefficient in the present invention and in the prior art.

DETAILED DESCRIPTION OF THE INVENTION

Below, a digital coding apparatus according to an embodiment of the present invention will be described with reference to the drawings.

Figure 1:
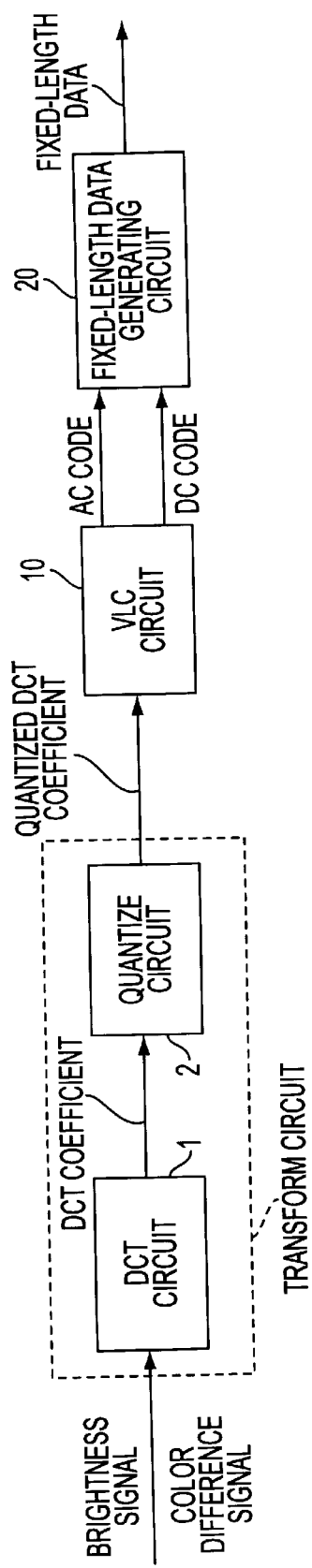
FIG. 1 is a block diagram showing a digital coding apparatus according to an embodiment of the present invention.

FIG. 1 is a block diagram showing the basic structure of the digital coding apparatus according to the embodiment of the present invention. In the drawing are shown: a discrete cosine transform circuit (hereinafter referred to as DCT circuit) 1; a quantize circuit 2; a variable-length coding circuit (hereinafter referred to as VLC circuit) 10; and a fixed-length data generating circuit 20. The DCT circuit 1 and the quantize circuit 2 compose a transform circuit.

The DCT circuit 1 performs a two-dimensional discrete cosine transform with respect to a brightness signal or a color difference signal of image data divided into small blocks of 8×8 pixels.

From the transfer coefficient matrix, the individual elements are sequentially read out as a DCT coefficient consisting of one DC coefficient and 63 AC coefficients in the order in which the element representing the lowest-frequency component is read first, as shown in FIG. 11.

The quantize circuit 2 quantizes the DCT coefficient outputted from the DCT circuit 1 and outputs it as a quantized DCT coefficient.

The VLC circuit 10 codes the DC coefficient to a DC code, while coding the AC coefficients to AC codes. In the process, variable-length Huffman coding is used.

The fixed-length data generating circuit 20 generates fixed-length data from the DC code and AC codes. The foregoing basic structure is the same as that of the prior art.

Figure 2:
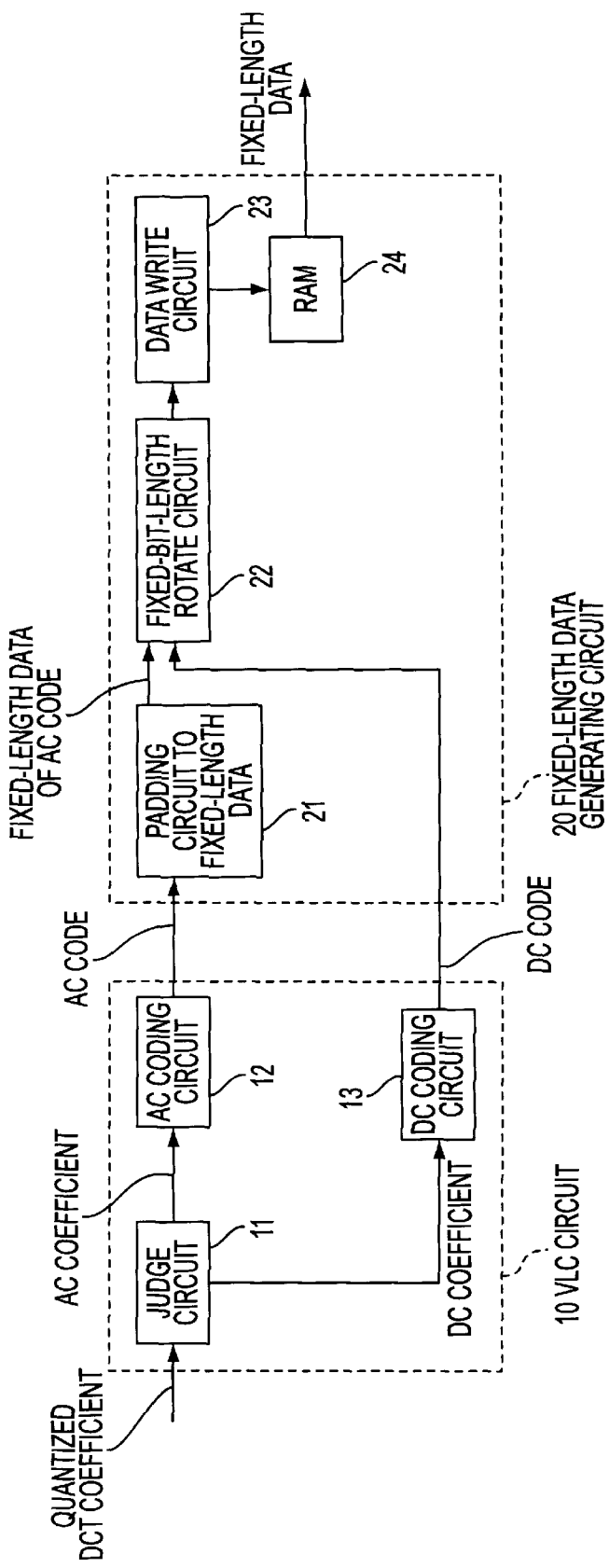
FIG. 2 is a block diagram showing the respective internal structures of a VLC circuit and of a fixed-length data generating circuit in the digital coding apparatus according to the embodiment of the present invention.

FIG. 2 is a block diagram showing the internal structures of the VLC circuit 10 and of the fixed-length data generating circuit 20 in the digital coding apparatus according to the embodiment of the present invention. In the drawing are shown: a judge circuit 11; an AC coding circuit 12; a DC coding circuit 13; a padding circuit 21 to fixed-length data; a fixed-bit-width rotate circuit 22; a data write circuit 23; and a memory (RAM) 24.

The judge circuit 11 judges whether each of the components of the DCT coefficient is the DC coefficient or AC coefficient and outputs the AC coefficients to the AC coding circuit 12, while outputting the DC coefficient to the DC coding circuit 13.

The AC coding circuit 12 detects a sequence of zero-valued AC coefficients, counts the number of the consecutive 0s, transforms the number in combination with the AC coefficient having a nonzero value to variable-length Huffman codes, and outputs them as the AC codes.

The DC coding circuit 13 transforms the DC coefficient to the DC code and outputs it. However, in the case where the DC coefficient is used as it is as the DC code without being transformed, the DC coding circuit 13 becomes unnecessary.

The padding circuit 21 pads fixed-length data compactly with the variable-length AC code or AC codes in sequence. If each of the maximum code length of the AC code and the length of the fixed-length data is assumed to be 16 bits, the number of words required as the fixed-length data becomes the largest when one AC code is assigned to one AC coefficient and the code length of each of the assigned codes except the EOB code is 16 bits, which is maximum. When each of the AC coefficients is 0, the AC code is composed only of the EOB, so that the number of words required as the fixed-length data becomes minimum. Consequently, the largest number of items of fixed-length data of AC code is 64 words, while the minimum item of fixed-length data is 1 word.

In the case where the fixed-length data of AC code has the largest number of items, the 64th word is composed only of the EOB code. If it is assumed here that the EOB code is composed of, e.g., 4 bits, a 12-bit unused portion is produced at the end of the fixed-length data corresponding to the 64th word. If the unused portion is shifted to the head by any means in order to store the DC code without disturbing pipeline processing, it becomes possible to perform pipeline processing with respect to the DC code as well as to the AC codes. The present invention has been achieved by focusing on the foregoing fact.

Figure 3A:
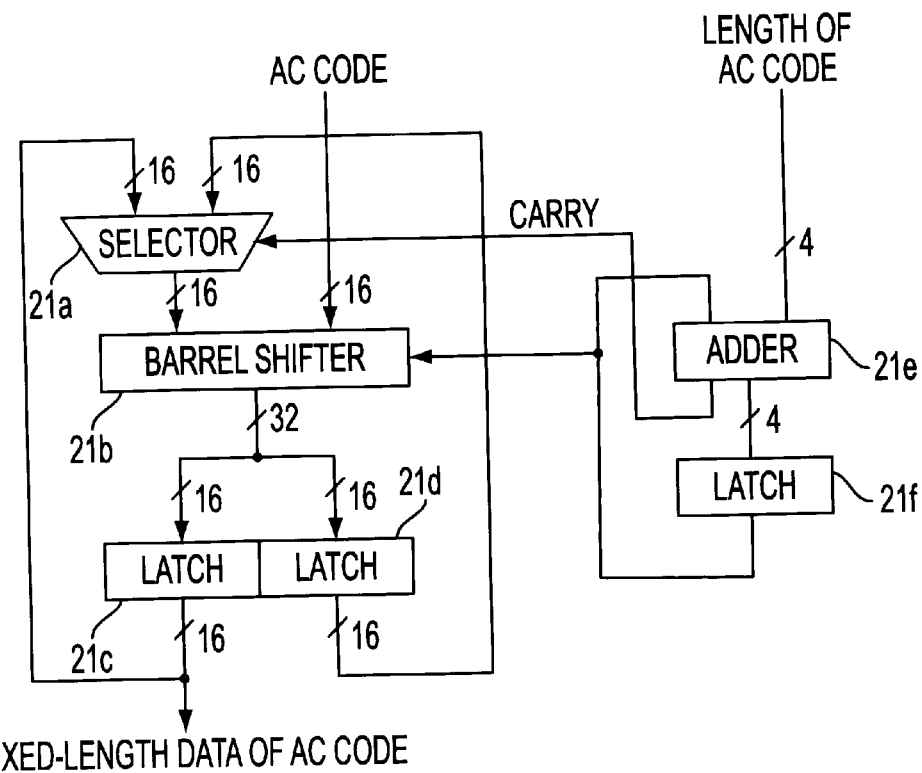
FIG. 3(a) is a block diagram showing an example of the structure of a padding circuit to fixed-length data in the digital coding apparatus according to the embodiment of the present invention.

FIG. 3(a) is a block diagram showing an example of the structure of the padding circuit 21 to fixed-length data. Here, it is assumed that each of the maximum code length of the AC code and the length of the fixed-length data is 16 bits and that the code length represented by 4 bits is inputted in conjunction with the AC code. In the drawing are shown: a selector 21a; a barrel shifter 21b; 16-bit latches 21c and 21d; a 4-bit adder 21e; and a 4-bit latch 21f.

The AC code is inputted together with the output data from the selector 21a to the barrel shifter 21b, connected to the AC code that has already been held in the latch circuit 21c or 21d, and then outputted. Of 32-bit data outputted from the barrel shifter 21b, the upper 16 bits are temporarily held in the latch 21c, while the lower 16 bits are temporarily held in the latch 21d. When the data held in the latch 21c is entirely composed of the AC codes, it is outputted as the fixed-length data to the fixed-bit-width rotate circuit 22.

The code length of the AC code is inputted to the adder 21e and added to the result of the previous addition temporarily held in the latch 21f. The latch 21f also outputs the addition result held therein to the barrel shifter 21b. A carry signal outputted from the adder 21e is inputted to the selector 21a. When a carry is produced, the selector 21a selectively outputs the data held in the latch 21d. When a carry is not produced, on the other hand, the selector 21a selectively outputs the data held in the latch 21c.

Figure 3B:
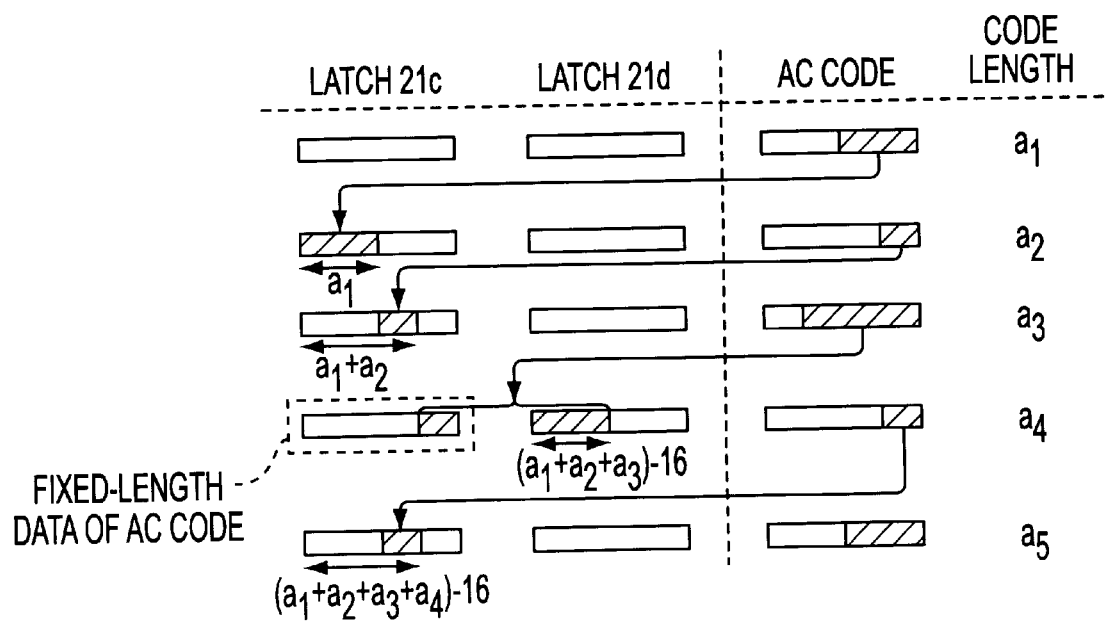
FIG. 3(b) is a view showing the generation of fixed-length data of AC code in the padding circuit to fixed-length data.

FIG. 3(b) is a view showing the generation of the fixed data of AC code in the padding circuit 21 to fixed-length data. Here, it is assumed that the AC codes having respective code lengths of $a_1$, $a_2$, $a_3$, $a_4$, and $a_5$ are successively inputted.

Initially, when the AC code having the code length $a_1$ is inputted, the latch 21c holds the AC code justified to the left, while the latch 21f holds the data $a_1$ outputted from the adder 21e. The position in which the AC code is held is determined by the data $a_1$ outputted from the latch 21f. The latch 21f newly holds data $(a_1+a_2)$ which represents a position in which the subsequent AC code is to be held.

The subsequent AC code having the code length of $a_3$ is then inputted and connected to the preceding AC code. However, since $(a_1+a_2+a_3)$ exceeds 16, a part of the AC code having the code length of $a_3$ is connected and outputted as the fixed-length data of AC code. The remaining portion of the AC code having the code length of $a_3$ is held in the latch 21d. Since a carry is produced in the adder 21e, the selector 21a selectively outputs the data held in the latch 21d when the subsequent AC code is inputted.

Next, the AC code having the code length of $a_4$ is inputted and connected to the remaining portion of the AC code having the code length of $a_3$ so as to be held justified to the left in the latch 21c.

The fixed-bit-width rotate circuit 22 closely connects the fixed-length data of AC code to the DC code so that the DC code is positioned at the head.

If it is assumed here that the DC code is composed of 12 bits and the EOB code is composed of 4 bits, the operation of the fixed-bit-width rotate circuit 22 in each clock can be represented by the following simple numerical expressions:

if (code=DC code)
TMP ←DC; OUT ←{TMP, IN[15:12]};
else
TMP←IN[11:0]; OUT←{TMP, IN[15:12]};

where DC is the DC code to be inputted, IN is fixed-length data of AC code to be inputted, OUT is fixed-length data to be outputted, TMP is data held in a TMP register, IN[15:12] is the upper 4 bits of the fixed-length data of AC code to be inputted, and IN[11:0] is the lower 12 bits of the fixed-length data of AC code to be inputted. The operation can be implemented by a circuit of extremely simple structure.

Figure 4A:
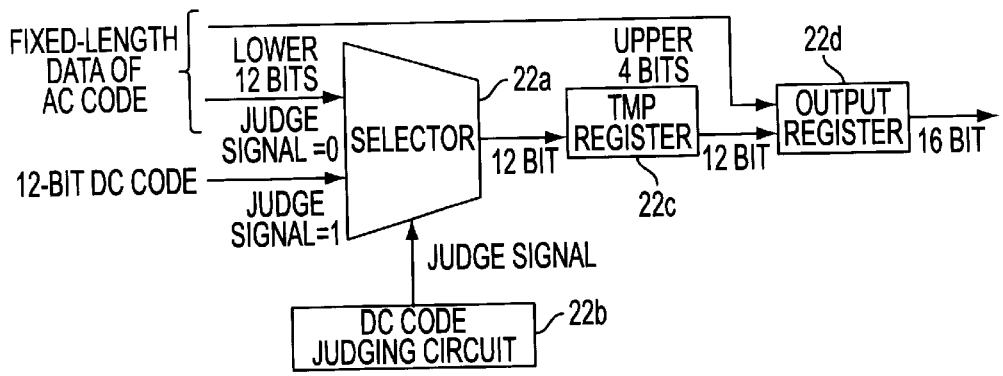
FIG. 4(a) is a block diagram showing an example of the structure of a fixed-bit-width rotate circuit in the digital coding apparatus according to the embodiment of the present invention.

FIG. 4(a) is a block diagram showing an example of the structure of the fixed-bit-width rotate circuit 22. In the drawing are shown: a selector 22a; a DC code judge circuit 22b; a TMP register 22c; and an output register 22d.

The DC code judge circuit 22b outputs "1" as a judge signal upon the inputting of the DC code and outputs "0" at all other times. The selector 22a outputs the lower 12 bits of each inputted fixed-length data of AC code when the judge signal is "0" and outputs the 12-bit DC code when the judge signal is "1". The TMP register 22c is a 12-bit register which outputs the 12-bit DC data received from the selector 22a after holding it during 1 clock. The output register 22d connects the 12-bit data outputted from the TMP register 22c to the upper 4 bits of each inputted fixed-length data of AC code and outputs a 16-bit item of fixed-length data.

Figure 4B:
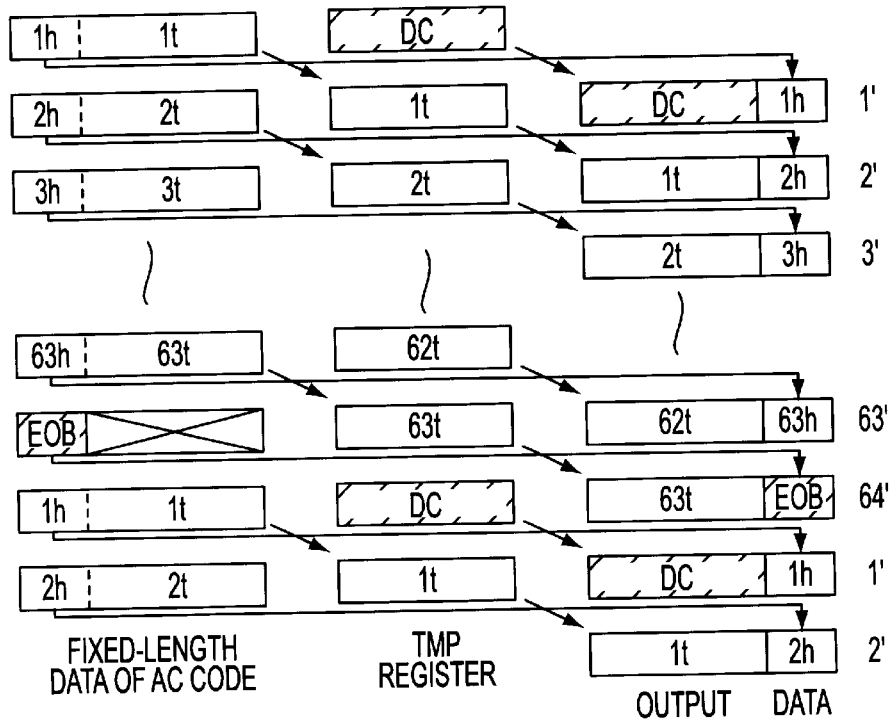
FIG. 4(b) is a view showing the transform of the fixed-length data in the fixed-bit-width rotate circuit.

FIG. 4(b) shows the transform of the fixed-length data in the fixed-bit-width rotate circuit 22 in the case where the number of words of the fixed-length data of AC code becomes the largest. In the drawing, a small letter h represents the upper 4 bits of the fixed-length data of AC code and a small letter t represents the lower 12 bits of the fixed-length data of AC code.

Initially, the upper 12 bits of the first word of the output data are occupied by the DC code, while the lower 4 bits thereof are occupied by the upper 4 bits of the fixed-length data of the first AC code. The upper 12 bits of the second word are occupied by the lower 12 bits of the fixed-length data of the first AC code, while the lower 4 bits thereof are occupied by the upper 4 bits of the fixed-length data of the second AC code. Likewise, when n=3 to 63, the upper 12 bits of the n-th word of the output data are occupied by the lower 12 bits of the fixed-length data of the (n−1)-th AC code, while the lower 4 bits thereof are occupied by the upper 4 bits of the fixed-length data of the n-th AC code.

In the 64th word of the output data, the upper 12 bits are occupied by the lower 12 bits of the fixed-length data of the 63th AC code, while the lower 4 bits are occupied by the EOB code. Thus, with the fixed-bit-wide rotate circuit 22 constituted as shown in FIG. 4(a), there can be implemented the operation of rotating the fixed-length data of each of the AC codes by 4 bits toward the MSB and occupying the unused 12 bits starting from the MSB of the first word with the DC code.

The data write circuit 23 stores in the memory 24 the fixed-length data outputted from the fixed-bit-width rotate circuit 22. Since this is the simple operation of writing the fixed-length data of 1 word minimum to 64 words maximum in the memory, the operation can easily be implemented by pipeline processing.

Thus, with the digital coding apparatus according to the embodiment of the present invention, each processing can be performed by pipeline processing not only in the VLC circuit 10 but also in the fixed-length-data generating circuit 20.

Figure 5:
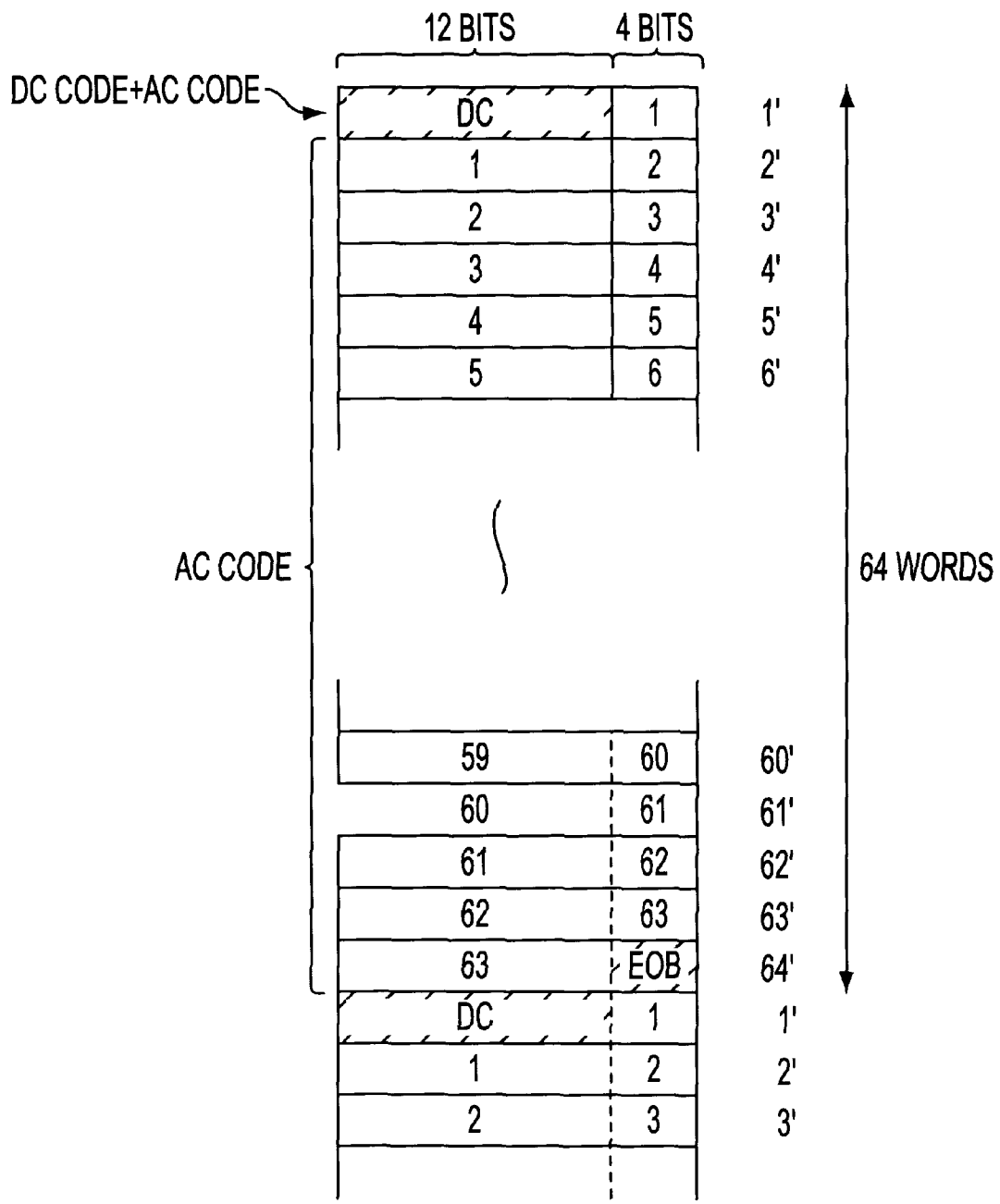
FIG. 5 is a view showing the content of the fixed-length data generated by the digital coding apparatus according to the embodiment of the present invention.
Figure 9:
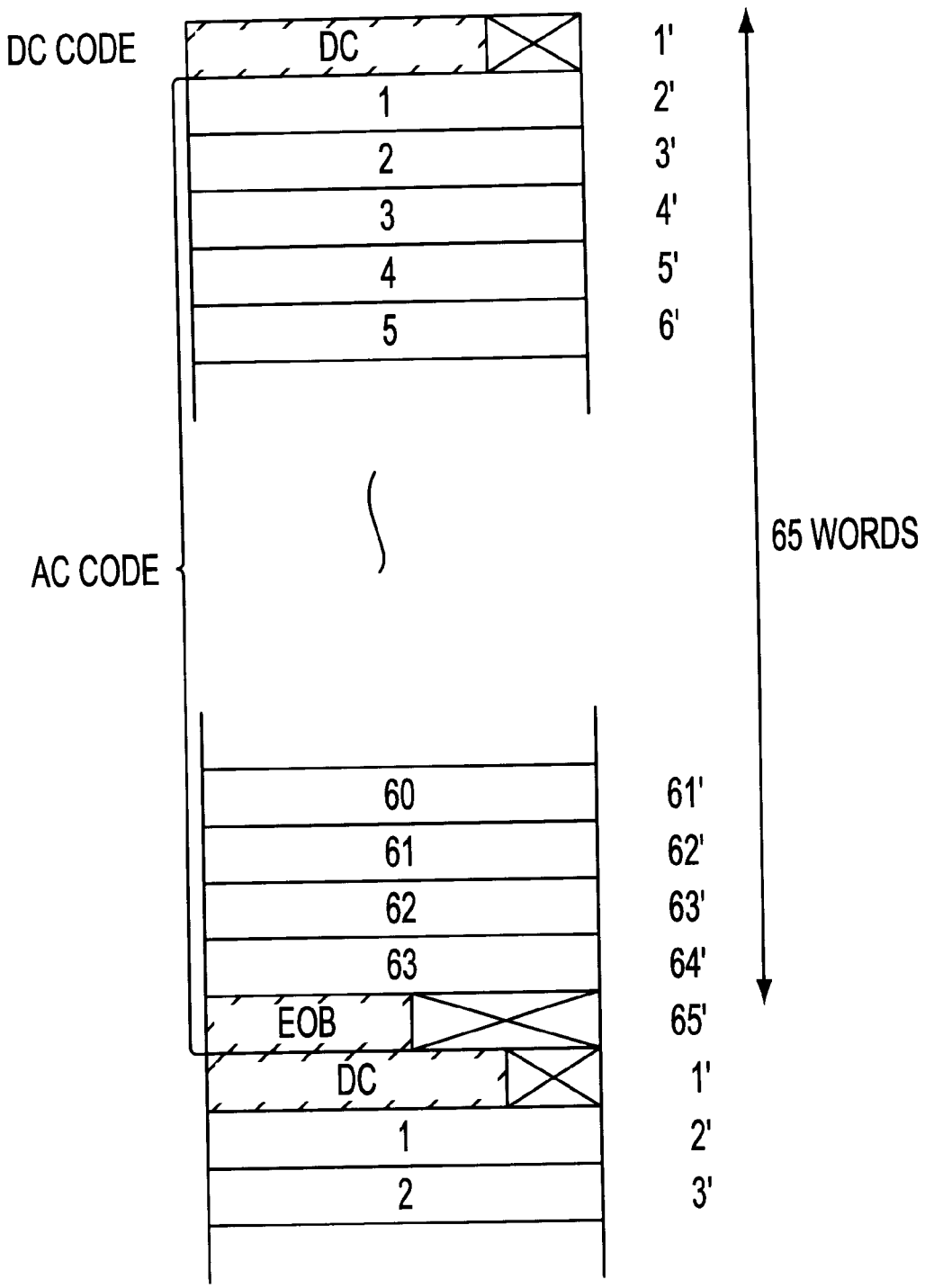
FIG. 9 is a view showing the content of fixed-length data generated by the conventional digital coding apparatus.
Figures 10A, 10B:
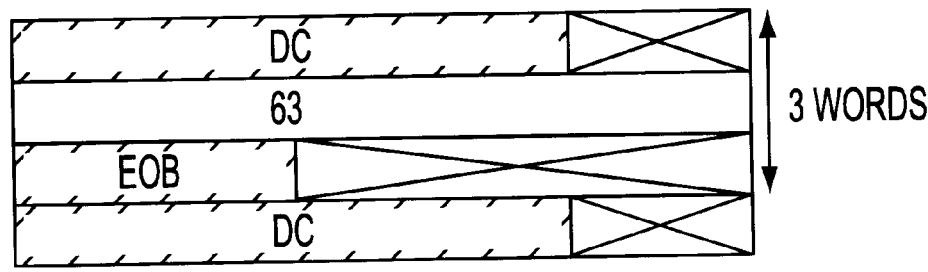
FIG. 10(a) shows a DCT coefficient and FIG. 10(b) shows the content of the fixed-length data generated from the DCT coefficient of FIG. 10(a)

FIG. 5 shows the content of the fixed-length data generated by the digital coding apparatus according to the embodiment of the present invention in the case where the number of items of fixed-length data is the largest, i.e., where 63 AC codes are given and each of the AC codes has the maximum length. Unlike the conventional embodiment shown in FIG. 9, the sum of the code length of the DC code and the code length of the EOB code is equal to or shorter than the length of the fixed-length data. Moreover, since the AC codes have been rotated by given fixed bits and connected to the DC code, the largest number of words of the fixed-length data generated from one DCT coefficient is 64. By the storage method, the storage area for the fixed-length data can be reduced. Furthermore, the addition of the DC code causes no increase in the number of clocks and data can sequentially be processed by pipeline processing in 64 clocks, similarly to the conventional embodiment.

Figure 6:
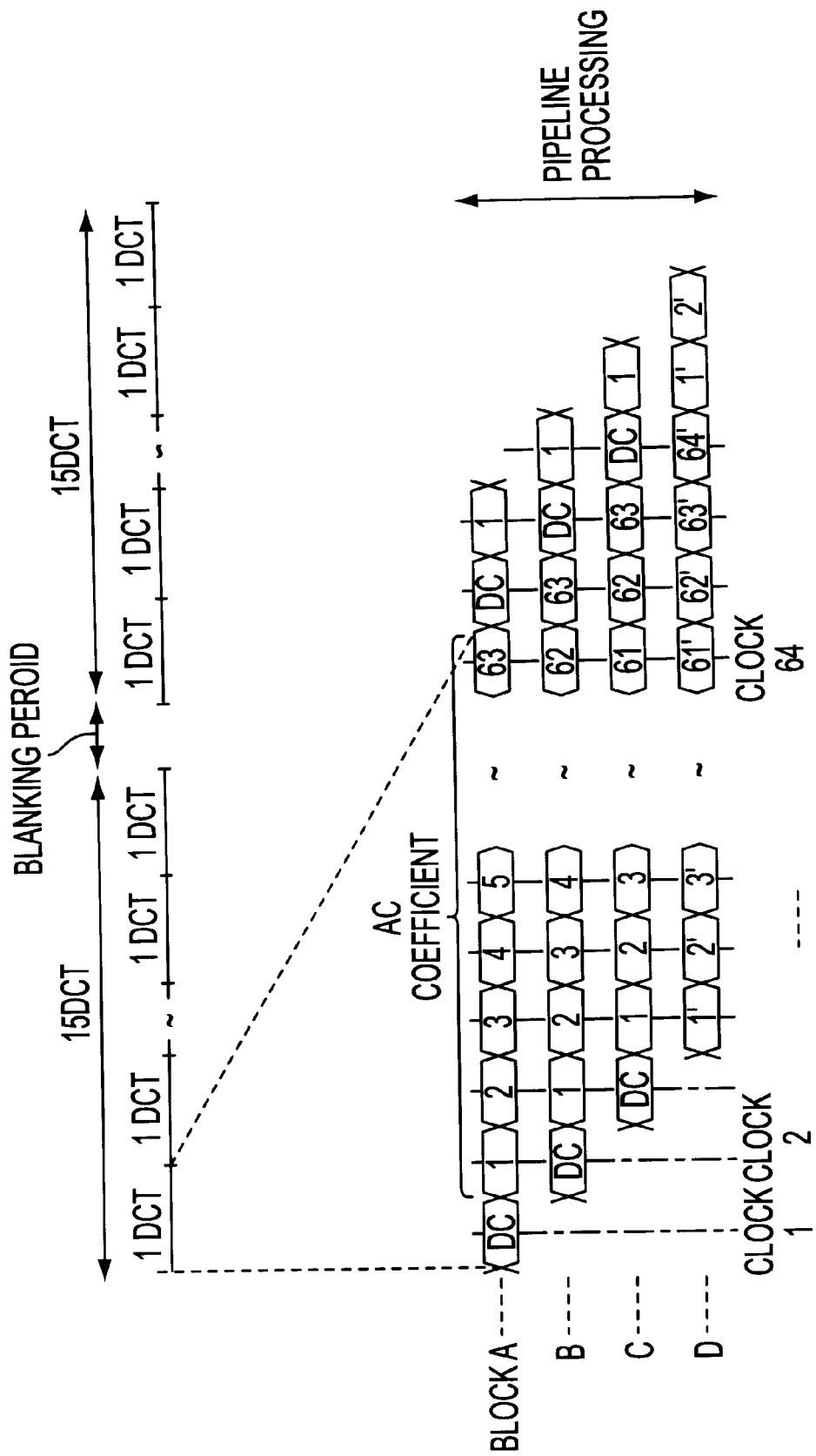
FIG. 6 is an operational timing chart of the digital coding apparatus according to the embodiment of the present invention.
Figure 8:
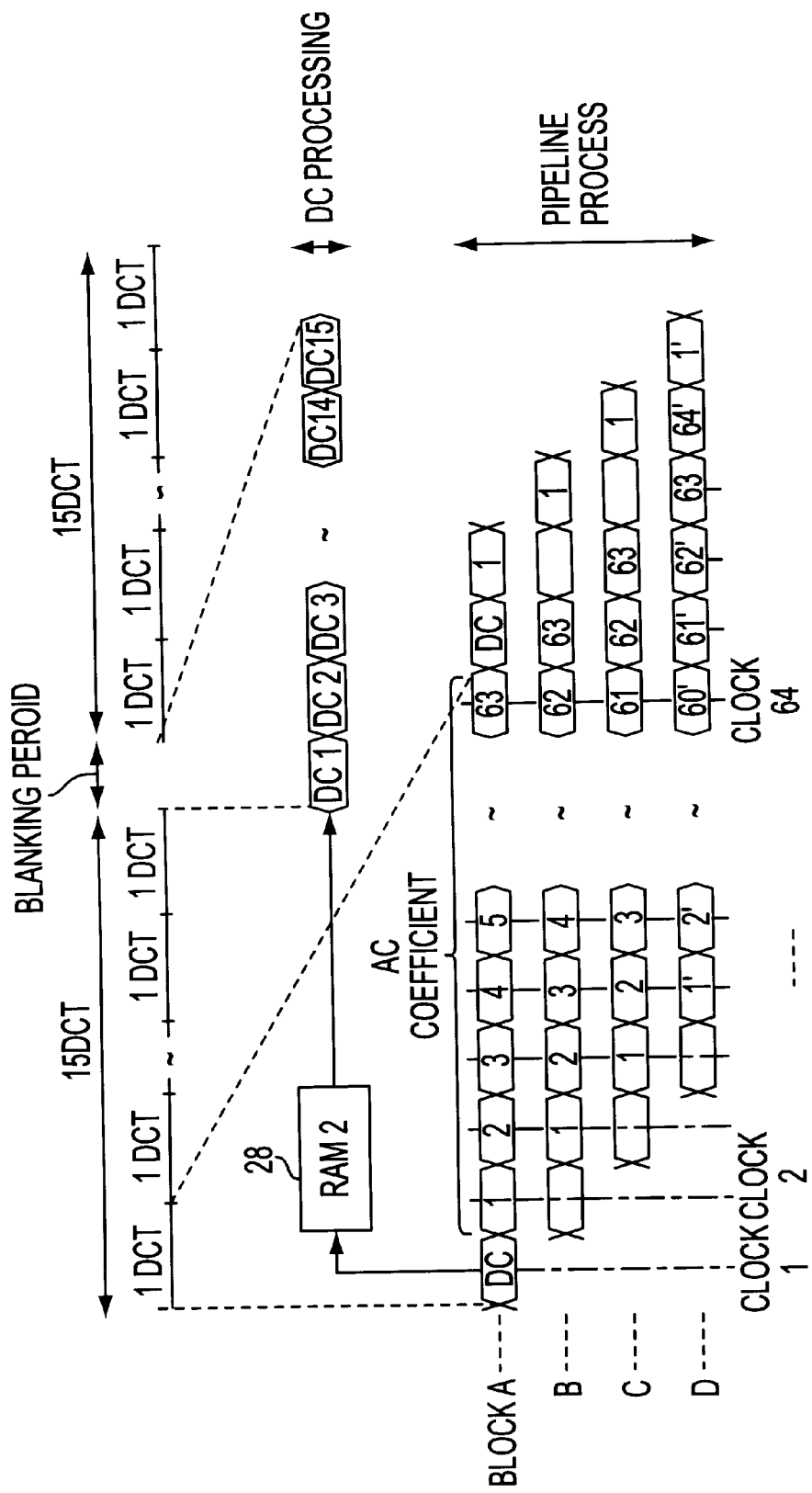
FIG. 8 is an operational timing chart of the conventional digital coding apparatus.

FIG. 6 is an operational timing chart of the digital coding apparatus according to the embodiment of the present invention. Unlike the operational timing chart of the conventional circuit shown in FIG. 8, no non-pipeline processing for processing the DC code is observed during the blanking period.

Thus, with the digital coding apparatus according to the embodiment of the present invention, the circuit for processing the DC code becomes unnecessary and the processing of the DC code except during the period of pipeline processing also becomes unnecessary. Compared with the conventional system in which the AC code processing and the DC code processing are separately performed, therefore, there can be achieved the effects of a significant circuit reduction and the lowering of power consumption due to a reduced number of clocks for processing.

To the DC code, information for image processing such as motion detection may be added. In practice, the data format in DVC (Digital Video Cassette) is composed of a total of 12 bits, of which 9 bits are for the DC code, 1 bit is for motion detection and 2 bits are for class information, as additional information on image data. Since the EOB code is composed of 4 bits, the present invention can be implemented.

A specific description will be given to the effects of the circuit reduction and the lowering of power consumption achieved by the digital coding apparatus according to the embodiment of the present invention.

Figure 7:
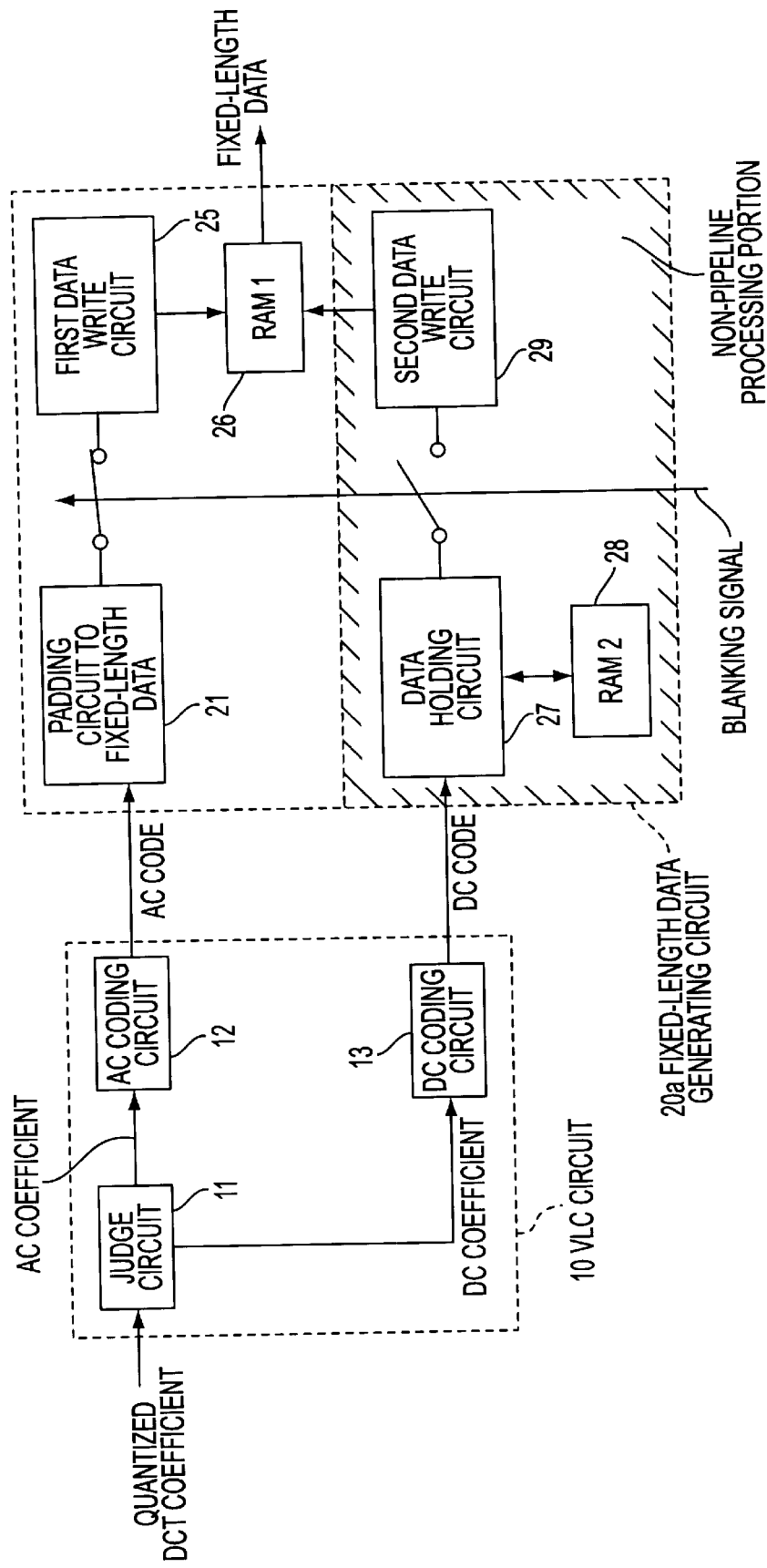
FIG. 7 is a block diagram showing the respective internal structures of a VLC circuit and of a fixed-length data generating circuit in a conventional digital coding apparatus.

If the circuit of the present invention shown in FIG. 2 is compared with the conventional circuit shown in FIG. 7, the data holding circuit 27, the second memory 28, and second data write circuit 29 required by the conventional circuit become unnecessary in the circuit of the present invention. Instead, the fixed-bit-width rotate circuit 22 becomes necessary in the circuit of the present invention.

The fixed-bit-width rotate circuit 22 is an extremely small-scale circuit, as shown in FIG. 4(a). On the other hand, each of the data holding circuit 27 and the second data write circuit 29 is larger in scale than the fixed-bit-width rotate circuit 22, since they control the writing and reading of data in and from the memory and the writing of data in the memory, respectively. The data holding circuit 27 requires the second memory 28, the capacity of which becomes 12×15 bits in the case of sequentially processing 15 DCTs and subsequently processing the DC code during the blanking period. If the number of DCTs sequentially processed is represented by n, the capacity of the memory becomes 12×n bits. Consequently, the circuit scale is greatly reduced.

In contrast to the conventional digital coding apparatus which requires extra clocks for processing the DC code in addition to the clocks for the pipeline processing, the present embodiment does not require extra clocks. Consequently, power consumption can further be lowered by the synergetic effects of the circuit reduction and the reduced number of clocks for processing.

Furthermore, the digital coding apparatus according to the embodiment of the present invention does not necessarily require the blanking period. Consequently, sequential processing can be performed in the case of applying the digital coding apparatus to image processing with no blanking period such as recording image data in a storage medium such as a video memory or transmission of image data by Internet or the like, thereby implementing higher-speed processing than in the conventional embodiment. When the digital coding apparatus is applied to a monitor or the like with a blanking period, the blanking period can be utilized for another processing.

We claim:

1. A digital coding apparatus comprising:
   a transform circuit for performing a discrete cosine transform with respect to inputted data so as to:
      generate a DC coefficient and AC coefficients based on a result of the transform;
      output said DC coefficient and AC coefficients;
   a variable-length coding circuit for individually coding the DC coefficient and the AC coefficients, each outputted from said transform circuit, into a DC code and AC codes; and
   a fixed-length data generating circuit for generation plural items of fixed-length data based on the DC code and the AC codes, each outputted from said variable-length coding circuit, wherein
      said fixed-length data generating circuit generating the leading item of fixed-length data from said DC code and a leading portion of said AC codes, while sequentially generating the items of fixed-length data other than the leading one from a remaining portion of said AC codes; and
      the sum of a code length of said DC code and a code length of an EOB code representing an end position of the AC codes is always equal to or shorter than a length of said fixed-length data.

2. A digital coding apparatus according to claim 1, wherein
   said transform circuit has a quantize circuit which generates said DC coefficient and said AC coefficients by quantizing the result of the discrete cosine transform.

3. A digital coding apparatus according to claim 1, wherein
   said variable-length coding circuit and said fixed-length data generating circuit perform pipeline processing.

4. A digital coding apparatus according to claim 1, wherein
   when the number of bits of said fixed-length data is n and the number of bits of said DC code is m,
   said fixed-length data generating circuit has:
      a padding circuit to fixed-length data which receives said AC codes, sequentially connects the inputted AC codes, divides the connected AC codes into n-bit segments, and outputs the n-bit segments as fixed-length data of AC code; and
      a fixed-bit-width rotate circuit which receives said DC code and the fixed-length data of AC code outputted from said padding circuit to fixed-length data so as to generate the leading item of fixed-length data by connecting said DC code to the upper (n–m) bits of a leading item of the fixed-length data of AC code, while sequentially generating the items of fixed-length data other than the leading one by connecting the lower m bits of the fixed-length data of one of the AC codes to the upper (n–m) bits of the fixed-length of the subsequent one of the AC codes.

5. A digital coding apparatus comprising:
   a transform circuit for performing a discrete cosine transform with respect to inputted data so as to generate a DC coefficient and AC coefficients based on a result of the transform and output said DC coefficient and AC coefficients;
   a variable-length coding circuit for individually coding the DC coefficient and the AC coefficients, each outputted from said transform circuit, into a DC code and AC codes; and
   a fixed-length data generating circuit for generation of plural items of fixed-length data based on the DC code and the AC codes, each outputted from said variable-length coding circuit,
   wherein said fixed-length data generating circuit generating the leading item of fixed-length data from said DC code and a leading portion of said AC codes, while sequentially generating the items of fixed-length data other than the leading one from a remaining portion of said AC codes, and
   wherein the number of bits of said fixed-length data is n and the number of bits of said DC code is m, said fixed-length data generating circuit comprising:
- a padding circuit to fixed-length data which receives said AC codes, sequentially connects the inputted AC codes, divides the connected AC codes into n-bit segments, and outputs the n-bit segments as fixed-length data of AC code; and
- a fixed-bit-width rotate circuit which receives said DC code and the fixed-length data of AC code outputted from said padding circuit to fixed-length data so as to generate the leading item of fixed-length data by connecting said DC code to the upper (n−m) bits of a leading item of the fixed-length data of AC code, while sequentially generating the items of fixed-length data other than the leading one by connecting the lower m bits of the fixed-length data of one of the AC codes to the upper (n−m) bits of the fixed-length of the subsequent one of the AC codes.

* * * * *